United States Patent
Naito et al.

(10) Patent No.: US 9,645,454 B2
(45) Date of Patent: May 9, 2017

(54) TRANSPARENT CONDUCTIVE FILM AND ELECTRIC DEVICE

(71) Applicant: Kabushiki Kaisha Toshiba, Minato-ku (JP)

(72) Inventors: Katsuyuki Naito, Tokyo (JP); Norihiro Yoshinaga, Kawasaki (JP); Yoshihiro Akasaka, Kawasaki (JP); Tomio Ono, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 438 days.

(21) Appl. No.: 14/191,904

(22) Filed: Feb. 27, 2014

(65) Prior Publication Data

US 2014/0295179 A1 Oct. 2, 2014

(30) Foreign Application Priority Data

Apr. 1, 2013 (JP) ................................ 2013-076090

(51) Int. Cl.
*H01L 33/42* (2010.01)
*H01L 31/0224* (2006.01)
(Continued)

(52) U.S. Cl.
CPC .......... *G02F 1/13439* (2013.01); *B82Y 10/00* (2013.01); *B82Y 30/00* (2013.01);
(Continued)

(58) Field of Classification Search
CPC ......... G02F 1/13439; H01B 1/02; H01B 1/04; H01L 51/529; H01L 29/1606;
(Continued)

(56) References Cited

U.S. PATENT DOCUMENTS

2004/0233526 A1 11/2004 Kaminsky et al.
2008/0259262 A1 10/2008 Jones et al.
(Continued)

FOREIGN PATENT DOCUMENTS

CN 1349240 A 5/2002
CN 101636856 A 1/2010
(Continued)

OTHER PUBLICATIONS

Handbook of Thermoplastics, 2nd Edition, Olabisi et al. (eds.), p. 180 (2016).*

(Continued)

*Primary Examiner* — Ling Choi
*Assistant Examiner* — Catherine S Branch
(74) *Attorney, Agent, or Firm* — Oblon, McClelland, Maier & Neustadt, L.L.P.

(57) ABSTRACT

According to one embodiment, the transparent conductive film contains a laminated structure including a conductive layer and a transparent polymer layer. The conductive layer contains a metal nanowire and a carbon material including grapheme. The transparent polymer layer contains a transparent polymer having a glass transition temperature of 100° C. or less. The carbon material constitutes one surface of the transparent conductive film.

12 Claims, 5 Drawing Sheets

(51) Int. Cl.

| | | |
|---|---|---|
| G02F 1/1343 | (2006.01) | |
| B82Y 10/00 | (2011.01) | |
| B82Y 30/00 | (2011.01) | |
| C08J 7/06 | (2006.01) | |
| C09D 5/24 | (2006.01) | |
| H01L 29/16 | (2006.01) | |
| H01L 29/41 | (2006.01) | |
| H01L 51/44 | (2006.01) | |
| H01B 1/02 | (2006.01) | |
| H01B 1/04 | (2006.01) | |
| H01L 29/778 | (2006.01) | |
| H01L 29/06 | (2006.01) | |
| H01L 51/00 | (2006.01) | |
| H01L 51/42 | (2006.01) | |
| H01L 51/52 | (2006.01) | |

(52) U.S. Cl.
CPC .......... *C08J 7/06* (2013.01); *C09D 5/24* (2013.01); *H01B 1/02* (2013.01); *H01B 1/04* (2013.01); *H01L 29/1606* (2013.01); *H01L 29/413* (2013.01); *H01L 31/022466* (2013.01); *H01L 51/442* (2013.01); *H01L 51/529* (2013.01); *H01L 51/5215* (2013.01); *C08J 2333/08* (2013.01); *C08J 2333/10* (2013.01); *H01L 29/0673* (2013.01); *H01L 29/7781* (2013.01); *H01L 51/0097* (2013.01); *H01L 51/4226* (2013.01); *H01L 51/4253* (2013.01); *H01L 51/5212* (2013.01); *Y02E 10/549* (2013.01); *Y10T 428/269* (2015.01); *Y10T 428/30* (2015.01)

(58) Field of Classification Search
CPC . H01L 29/413; H01L 31/022466; C09D 5/24; B82Y 30/00; B82Y 10/00; C08J 7/06
See application file for complete search history.

(56) References Cited

U.S. PATENT DOCUMENTS

| | | | | |
|---|---|---|---|---|
| 2009/0133743 | A1* | 5/2009 | Matsui | H01G 9/2068 136/252 |
| 2009/0321364 | A1 | 12/2009 | Spaid et al. | |
| 2012/0033367 | A1 | 2/2012 | Jones et al. | |
| 2012/0098028 | A1 | 4/2012 | Naito | |
| 2013/0078436 | A1 | 3/2013 | Naito et al. | |
| 2013/0078449 | A1 | 3/2013 | Naito et al. | |
| 2013/0081678 | A1 | 4/2013 | Naito et al. | |
| 2013/0255763 | A1 | 10/2013 | Naito et al. | |
| 2013/0255764 | A1 | 10/2013 | Naito et al. | |

FOREIGN PATENT DOCUMENTS

| | | | |
|---|---|---|---|
| JP | 2005-243604 A | 9/2005 | |
| JP | 2008-251217 | 10/2008 | |
| JP | 2009-70660 A | 4/2009 | |
| JP | 2009-127092 | 6/2009 | |
| JP | 2009-129607 A | 6/2009 | |
| JP | 2009-252493 | 10/2009 | |
| JP | 2010-525526 | 7/2010 | |
| JP | 2010-177135 | 8/2010 | |
| JP | 2010-282729 A | 12/2010 | |
| JP | 2012-9359 | 1/2012 | |
| JP | 2012-89786 A | 5/2012 | |
| JP | 2012-94254 A | 5/2012 | |
| JP | 2013-53241 A | 3/2013 | |
| WO | WO 2008/131304 A1 | 10/2008 | |
| WO | WO 2012040637 A2 * | 3/2012 | ............... H01B 1/02 |

OTHER PUBLICATIONS

Tool and Manufacturing Engineers Handbook, vol. VIII: Plastic Part Manufacturing, 4th edition, Mitchell (ed.), p. 2-19 (1998).*
Search Report issued Nov. 11, 2015 in European Patent Application No. 14 156 121.7.
Extended European Search Report issued Nov. 10, 2014 in Patent Application No. 14184734.3.
L.S. Panchakarla, et al., "Synthesis, structure, and properties of Boron- and Nitrogen-doped graphene", Advanced Materials, vol. 21, XP055139397, Aug. 2009, pp. 4726-4730.
Jin Ok Hwang, et al., "Workfunction-tunable, N-doped reduced graphene transparent electrodes for high-performance polymer light-emitting diodes", ACS Nano, vol. 6, No. 1, XP055150332, Jan. 2012, pp. 159-167.
The Extended European Search Report issued Jul. 17, 2014, in Application No. / Patent No. 14156121.7-1303.
Yang Liu, et al., "Transparent, flexible conducting graphene hybrid films with a subpercolating network of silver nanowires", Journal of Materials Chemistry C, (RSC Publishing), vol. 1, No. 17, Mar. 6, 2013, XP055127748, pp. 2970-2974.
Office Action issued on Jun. 1, 2015 in Korean Patent Application No. 10-2014-0024157 with English translation.
Office Action issued on Sep. 8, 2015 in the counterpart European Application No. 14184734.3.
Combined Chinese Office Action and Search Report issued Dec. 25, 2015 in Patent Application No. 201410089745.X (with English language translation).
Office Action mailed Feb. 7, 2017 in Japanese Patent Application No. 2013-076090.

* cited by examiner

TRANSPARENT CONDUCTIVE FILM AND ELECTRIC DEVICE

CROSS-REFERENCE TO RELATED APPLICATIONS

This application is based upon and claims the benefit of priority from Japanese Patent Application No. 2013-076090 filed Apr. 1, 2013; the entire contents of which are incorporated herein by reference.

FIELD

Embodiments described herein generally relate to a transparent conductive film and an electric device.

BACKGROUND

Conductive materials such as carbon materials (e.g., carbon fibers, carbon nanotubes, graphenes, etc.) and metallic nanomaterials (e.g., metal nanoparticles, metal nanowires, etc.) are known. By using such a conductive material, developments of electric devices such as liquid crystal display and photoelectric conversion devices (e.g., organic EL devices, solar cells, optical sensors, etc.) have been made.

In the case of conductive materials obtained by using a carbon material, the used amount of rare metals or the like can be significantly reduced, or such a metal is not used at all in some cases. The conductive material using a carbon material also shows large mechanical strength in addition to high flexibility. Moreover, since this conductive material is chemically stable, it has drawn attention as a promising conductive material.

Although the conductive material obtained by using the carbon material has a relatively high electrical conductivity, the resistance in conduction between molecules is large. In the case where the conductive material is used as a transparent electrode with a large area, the electrical resistance becomes higher in the same light transmittance compared to an indium-tin oxide (ITO) film. When such a conductive material is used as a long distance wire or the like, the electrical resistance is further higher compared to a metal conductive material such as copper (Cu).

Since the metal nanomaterial has high conductivity, its composite in combination with a carbon material has been used for achieving an improvement in conductivity.

Electric devices such as liquid crystal display, solar cells, and organic EL devices have a pair of electrodes and a functional layer disposed between the pair of electrodes. At least one of the electrodes is a transparent electrode, and an ITO film is generally used as the transparent electrode.

As the negative electrode of the photoelectric conversion device such as a solar cell and an organic EL device, there have been used aluminum (Al) having a small work function and a magnesium (Mg) alloy having a much smaller work function. A photoelectric conversion device in which an ITO film is used for the negative electrode and a metal having a large work function is used for the positive electrode is also known, though its efficiency is low.

Indium (In), which is a rare metal, is used as the ITO film. As a stable and flexible transparent electrode that can be prepared at low cost without using the In, carbon nanotubes with an unsubstituted graphene structure and planar graphene thin films have been studied as the transparent electrode.

DETAILED DESCRIPTION

According to an embodiment, the transparent conductive film contains a laminated structure including a conductive layer and a transparent polymer layer. The conductive layer contains a metal nanowire and a carbon material including grapheme. The transparent polymer layer contains a transparent polymer having a glass transition temperature of 100° C. or less. The carbon material constitutes one surface of the transparent conductive film.

Hereinafter, the embodiments will be described with reference to the drawings.

If a transparent electrode film is formed in combination with a conductive layer containing a graphene and a silver nanowire, and a polymer layer, a polymer having a high glass transition temperature is used. The transparent electrode film itself thus prepared shows a high heat resistance and a large rigidity. Because processing at high temperature is required in preparing the electric device by lamination to the device, characteristics are deteriorated in the case of the device with a low heat resistance.

However, poor contact might occur if processing at low temperatures is performed in order to avoid the deterioration in the characteristics of the device. In addition, insulation breakdown of the device is likely to occur due to its hard film. Further, since a film with a large rigidity tends to become brittle, a decrease in the flexibility might occur in some cases.

In an organic EL device and a solar cell, improvement of light extraction efficiency and photoelectric conversion efficiency is achieved by using metal nanowires, but it is difficult to take full advantage of the effect of the metal nanowires.

The present inventors have found that a device can be prepared by lamination via a low temperature processing, resulting in discovery of a transparent conductive film that is highly more flexible and stable, thereby to obtain an electric device with high performances.

First Embodiment

Figure 1:
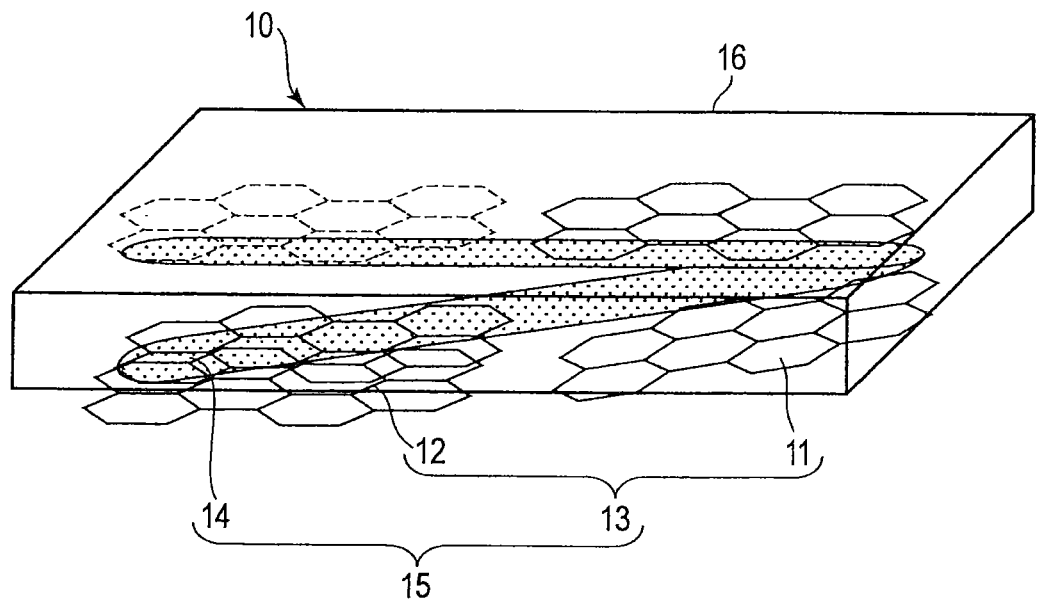
FIG. 1 is a schematic view showing an embodiment of a transparent conductive film.

FIG. 1 is a schematic view showing an example of a transparent conductive film 10 of an embodiment. The transparent conductive film 10 shown in the drawing comprises a monolayer graphene 11 and a multilayer graphene 12 as carbon materials 13, a metal nanowire 14 laminated on the carbon materials, and a transparent polymer layer 16 on the metal nanowire 14. The conductive layer 15 is configured by the carbon material 13 and the metal nanowire 14. The transparent polymer layer 16 is configured from a transparent polymer having a glass transition temperature of 100° C. or less. In other words, the transparent conductive film 10 contains the laminated structure containing the conductive layer 15 and the transparent polymer layer 16.

The multilayer graphene 12 is configured from a plurality of monolayer graphenes 11, for example, two layers of monolayer graphene. It should be noted that both of the monolayer graphene 11 and the multilayer graphene 12 need not be necessarily included. That is, the carbon material 13 also means at least one of the monolayer graphene 11 and the multilayer graphene 12.

The monolayer graphene or multilayer graphene used in the present embodiment can be produced, for example, by the following method.

An example of a method for producing a monolayer graphene is as follows.

At first, by a chemical vapor deposition (CVD) method, a monolayer graphene is formed on a Cu foil as the base catalyst layer or on a Cu thin film formed on, for example, a silicon substrate. In the CVD method, methane, hydrogen, and argon are used as a mixed reactant gas of raw materials. A hydrocarbon selected from ethylene or acetylene, methanol, and ethanol may be used instead of methane. Then monolayer graphene is formed on the Cu foil by cooling under an argon atmosphere.

The surface of the Cu foil is preferably annealed beforehand by laser irradiation heating to grow the crystal grains of the Cu foil. After the obtained monolayer graphene and a heat transfer film are pressure-bonded, the Cu foil is dissolved to transfer the monolayer graphene to the transfer film. The Cu foil is dissolved by immersing in an ammonia alkaline copper (II) chloride etchant, a ferric chloride aqueous solution, or an acid to dissolve Cu.

By transferring to a substrate such as a glass substrate from the heat transfer film, a desired monolayer graphene is obtained.

The multilayer graphene can be produced by laminating the monolayer graphene. Specifically, in the above method for producing a monolayer graphene, there is obtained a multilayer graphene by repeating the same procedure in the step of forming a monolayer graphene on a Cu foil. Alternatively, it is possible to prepare a multilayer graphene by heating with an Ni thin film instead of the Cu foil, followed by quenching. At high temperatures, much more carbon atoms dissolve in an Ni foil than in the case of the Cu foil. More carbon is deposited on the Ni surface by quenching. Also, in the case of using the Cu foil, the multilayer graphene is obtained through one step by appropriately selecting the conditions for the CVD method.

The graphene can also be formed on the Cu foil by using plasma. For example, plasma can be generated by the combination of a mixed atmosphere of methane, hydrogen and argon with a microwave.

The graphene may also be produced by using an aqueous dispersion solution of graphene oxide. First, the aqueous dispersion solution of graphene oxide is applied on a quartz glass or a metal (e.g., on Cu) by dip coating, spin coating, spray coating, ink jet coating, or the like, thereby forming a graphene oxide thin film. The graphene oxide thin film obtained is reduced with hydrogen iodide, sodium borohydride, or hydrazine to form a graphene. When forming a graphene oxide thin film, it also can be patterned by screen printing, inkjet printing, offset printing, and the like.

In addition, the graphene also can be prepared by using a polymer compound selected from polystyrene, polyacrylonitrile, and polyimide. A polymer thin film is formed by applying such a polymer compound onto a quartz glass or a metal. The resulting polymer thin film is graphitized by heating under vacuum or argon and transferred to another substrate, thereby to prepare a desired graphene.

A part of the carbon atoms in the graphene may be substituted with a boron atom or a nitrogen atom.

A graphene in which a part of carbon atoms is substituted with at least a nitrogen atom (nitrogen-substituted graphene) can be produced by a modified CVD method as follows. For example, the nitrogen-substituted graphene can be produced by mixing a raw material methane with ammonia or by the CVD method using a low-molecular weight nitrogen compound that contains a nitrogen atom and a carbon atom (e.g., pyridine, methylamine, ethylenediamine, urea, etc.). Further, graphene oxide may be treated with hydrazine and then heated, or graphene may be treated in an ammonia stream at an elevated temperature, thereby to provide the nitrogen-substituted graphene. Moreover, by treating a nitrogen-containing polymer at a high temperature, it is also possible to obtain a nitrogen-substituted graphene.

The nitrogen atoms are classified into quaternary nitrogen atoms, pyridine nitrogen atoms, pyrrole/pyridone nitrogen atoms, and nitrogen atoms bonded to oxygen atoms. The nitrogen atom to substitute a part of the carbon atoms of the graphene has the ability to coordinate with a metal material, and makes the bonding between the graphene and the metal material stronger. Further, electron transfer is more prone to occur due to the presence of the nitrogen atom, so that the electrical resistance at the interface between the graphene and the metal material is reduced. In addition, the presence of nitrogen atoms makes it possible to protect the metallic material that is easy to oxidation or sulfurization.

In the X-ray photoelectron spectra of the is electron of the nitrogen atom by the X-ray photoelectron spectroscopy (XPS), it is preferred that the intensity of 401.2 eV is greater than the intensity of 398.5 eV. The nitrogen atom corresponding to the intensity of 401.2 eV is a quaternary nitrogen atom, which supplies electrons to the graphene skeleton. Because the number of carriers is increased due to the presence of the quaternary nitrogen atom, the conductivity increases with the reduction of the work function.

Meanwhile, the nitrogen atom corresponding to the intensity of 398.5 eV is a pyridine nitrogen atom. This pyridine nitrogen atom has acceptor properties, inhibits the effect of quaternary nitrogen atom, and becomes an electron trap. However, the pyridine nitrogen atom has a good bondability to a metal, which causes an effect of lowering the contact barrier. Therefore, the ratio of the intensity of 398.5 eV to the intensity of 401.2 eV is preferably 1/1.1 to 1/5.

If the amount of nitrogen atoms to the amount of carbon atoms in the graphene is too small, it is impossible to obtain a sufficient effect. On the other hand, if the amount of nitrogen atoms in the graphene is too large, electrical conductivity is reduced as a result of the disturbance of the graphene skeleton structure. If the amount of nitrogen atoms to carbon atoms is in the range of 1/5 to 1/1000, a desired effect can be obtained without these disadvantages. More preferably, the amount of nitrogen atoms to that of carbon atoms is 1/10 to 1/200.

Furthermore, in the XPS, the ratio of the peak intensity of the oxygen atom O1s around 530 eV to the peak intensity of the carbon atom C1s around 285 eV is preferably 1/6 or less. If the peak intensity ratio is larger than 1/6, the conductivity is lowered because electrons are trapped due to the acceptor properties of the oxygen atom. The peak intensity ratio is more preferably 1/50 to 1/300. If the peak intensity ratio is too small, the graphene becomes unstable to external oxygen.

In the measurement from a product, the surface of the conductive layer of interest is exposed to be measured by XPS. Since the graphene is stable to various solvents (e.g., methanol), impurities adsorbed on the surface of the graphene are removed by cleansing the surface with a solvent. Since the peak intensities of the oxygen atoms differ from one another in the case of adsorption of oxygen molecules and water molecules, it is desirable that the measurement of a sample by XPS is performed after allowing the sample to stand at 200° C. for one or more days under vacuum.

The ratio of carbon atoms and oxygen atoms, and the ratio of nitrogen atoms and carbon atoms may be measured by XPS. Since the signal sensitivities are different depending on the apparatus, the signal intensity of each element can be corrected by using, as a reference substance, a material whose composition is known. For example, carbon nitride having a composition ratio of $C_3N_4$ can be used as a C/N standard substance.

In the case where a part of the carbon atoms in the graphene is substituted with boron atoms (boron-substituted graphene), the following effects can be obtained. For example, by substituting a part of carbon atoms with a trivalent boron atom, the work function as well as the electrical conductivity is increased. A transparent conductive film containing such graphene is preferable as an anode.

The boron substituted graphene can be obtained, for example, according to the following method. That is, in the CVD, boron-containing diborane, triethylboron, and trimethylboron in place of the nitrogen-containing compound are allowed to react with methane and hydrogen under an argon atmosphere. Other than this, it is possible to produce a boron-substituted graphene by the same method as in the case of the nitrogen-substituted graphene.

In the multilayer graphene 12, as the number of layers of graphene increases, the conductivity is increased, but the light transmittance is reduced. When the transparent conductive film of the present embodiment is used as a transparent electrode, the number of layers of graphene is preferably 8 or less, and is more preferably 4 or less. The number of layers of graphene can be determined by cross-sectional observation with use of a high-resolution transmission electron microscope (TEM).

In the transparent conductive film 10 of the present embodiment, the metal nanowire 14 is laminated on the carbon material 13.

A metal member having a diameter of about 10 to 200 nm and an average length of about 0.5 to 100 μm is usually referred to as a metal nanowire. The diameter and average length of the metal nanowire can be determined by the scanning electron microscope (SEM).

In the present embodiment, the metal nanowires 14 are intertwined with each other to configure the metal nanowire layer. If the diameter of the metal nanowire 14 is too small, the electrical resistance of the nanowire itself is increased, whereas, if the diameter is too large, there is a possibility that an increased light scattering or the like may reduce the transparency. If the diameter of the metal nanowire 14 is about 20 to 150 nm, such disadvantage is avoided. The diameter of the metal nanowire 14 is more preferably 40 to 120 nm.

If the average length of the metal nanowire 14 is too short, the electrical resistance is increased because entanglement between the nanowires is small. On the other hand, if the average length of the metal nanowire is too long, the dispersion into the solvent in the production of electrodes, etc. becomes unstable. In the case of the metal nanowire having an average length of about 1 to 40 μm, these disadvantages are avoided. The average length of the metal nanowire is preferably 5 to 30 μm.

The material of the metal nanowire 14 may be selected from silver (Ag), aluminum (Al), copper (Cu), gold (Au), tungsten (W), molybdenum (Mo), and an alloy containing these elements. Particularly, it is easy to prepare nanowires with Ag because it has a high conductivity and is stable. Further, Ag is most preferable because it has a high plasmon effect in addition to being usable in the preparation of an electrode as an aqueous dispersion. More preferably, when a small amount of palladium (Pd) is added to Ag to form an alloy, such alloy becomes more stable even in corrosive environments for sulfur (S) components or the like in air.

The remaining metals are preferable in the following points, respectively. Since Al is inexpensive, has a high conductivity, and is light, it is preferable, though severe process conditions due to its easy oxidation are required. Since Au is most stable, it is preferred to apply it to conductive materials such as semiconductors which particularly require reliability. Since Cu has a high conductivity and is more inexpensive than Ag, it is preferred. W is preferably applied to conductive materials exposed to high temperatures or high voltages. Since Mo has a good bonding state, it is preferably applied to electrodes for CIGS solar cells.

With the metal nanowire 14, the metal nanoparticles may be included in the metal nanowire layer. The metal nanowires are readily aggregated with the nanoparticles so that the nanoparticles act as an adhesive. Since the nanowires are satisfactorily bonded each other, it is possible to reduce the electrical resistance of the conductive film. A transparent conductive material such as ITO nanoparticles and a transparent conductive polymer may be included in the metal nanowire layer.

The metal nanowire 14 can be produced by reducing an aqueous metal ion solution using various reducing agents. The size and shape of the metal nanowires can be controlled by selecting the type of the reducing agents to be used, protective polymer, and coexisting ions. In the case of obtaining Ag nanowires, it is preferable that polyhydric alcohol such as ethylene glycol is used as the reducing agent, and poly(vinylpyrrolidone) is used as the protective polymer. A so-called nanowire of the nano-order can be obtained by these production methods.

It is possible to form a metal nanowire layer by applying a dispersion liquid of the metal nanowires by means of the method of spin coating, spray coating, applicator coating, or the like. The metal nanowires may be fused to each other by heating the obtained metal nanowires at a temperature of 100° C. or more or pressing it with a pressing machine, etc., thereby to further improve the conductivity. In addition, by using the metal nanowires of different diameters and types, a metal nanowire layer may be prepared. Thus, physical properties selected from surface resistance, total light transmittance, light reflectance, and Haze values can be changed.

As the transparent polymer configuring the transparent polymer layer 16 on the metal nanowires, there is employed an amorphous polymer having a glass transition temperature of 100° C. or less. Examples of the transparent polymer are listed below along with the glass transition temperatures. For example, there are exemplified polystyrene (100° C.), poly(cyclohexyl methacrylate) (92° C.), poly(t-butyl vinyl ether) (88° C.), poly(vinyl chloride) (81° C.), poly(ethylene terephthalate) (72° C.), poly(isobutyl methacrylate) (53° C.), poly(vinyl fluoride) (41° C.), poly(vinyl acetate) (30° C.), poly(butyl methacrylate) (20° C.), poly(cyclohexyl acrylate) (19° C.), poly(methyl acrylate) (10° C.), poly(2-cyanoethyl acrylate) (4° C.), poly(hexyl methacrylate) (−5° C.), atactic polypropylene (−13° C.), poly(vinylidene chloride) (−18° C.), poly(ethyl acrylate) (−24° C.), poly(butyl acrylate) (−54° C.), poly(allyl glycidyl ether) (−78° C.), silicone rubber (−120° C.), and the like.

The transparent polymer may be a block copolymer comprising a polymer with a high glass transition temperature and a polymer with a low glass transition temperature. In this case, as the polymer with a low glass transition temperature, a polymer having a glass transition temperature of 100° C. or less is used. Considering the flexibility and strength of the transparent polymer layer 16 to be obtained, a block copolymer comprising a polymer with a glass transition temperature of 100° C. or more and a polymer with a glass transition temperature of 10° C. or less is preferred. Further, in consideration of the transparency of the polymer layer to be obtained, a block copolymer containing a poly(acrylic acid ester) or a poly(methacrylic acid ester) is more preferred.

For example, the transparent polymer layer 16 may be formed by coating a solution or melt of the polymer as described above by means of spin coating, inkjet coating, applicator coating, or die coating.

Since the refractive index of the photoelectric conversion layer such as an LED is generally large, the light extraction efficiency to the outside also becomes smaller if the refractive index of the transparent polymer layer is small. If the refractive index of the transparent polymer layer at a wavelength of 550 nm is 1.6 or more, sufficient extraction efficiency is achieved. The polymer with a large refractive index has generally a high glass transition temperature as high as 100° C. or more. A low glass transition temperature and a high refractive index are compatible by mixing nanoparticles, such as titanium oxide, barium titanate, zirconium oxide, and the like.

If the refractive index of the transparent polymer layer 16 is too high, the scattering becomes larger or a large quantity of high refractive index nanoparticles is required. There is also a possibility that characteristics such as uniformity, flexibility, and flatness of the film are damaged in such a case. If the refractive index of the transparent polymer layer is 1.9 or less, such inconveniences are avoided.

A transparent polymer layer having a high refractive index can be prepared using, for example, nanoparticles having a high refractive index. Specifically, nanoparticles of high refractive index of about 10 to 100 nm in diameter are dispersed in a polymer solution to prepare a dispersion. This dispersion is applied to obtain a transparent polymer layer having a high refractive index. In order to obtain nanoparticles having a high refractive index, a metal salt as a raw material for the high refractive index nanoparticles is first dispersed in the polymer solution to obtain the dispersion. This dispersion is subjected to film formation and heated, thus making it possible to produce nanoparticles having a high refractive index.

The transparent conductive film 10 of the present embodiment can be obtained, for example, by laminating graphene and metal nanowires on a glass or metallic substrate. For example, the carbon material 13 is obtained by the formation of monolayer graphene or multilayer graphene by the CVD method, and the metal nanowire 14 is laminated thereon by coating or the like, thereby to form a metal nanowire layer. If necessary, the carbon material 13 and the layer of the metal nanowire 14 may be stacked alternately. After forming the transparent polymer layer 16 thereon, the whole structure is removed from the substrate to obtain a transparent conductive film of the present embodiment.

In a solar cell and a lighting device with a large area, since the energy conversion efficiency is reduced when the resistance of the transparent electrode is large, there is a case where metal wiring of a low resistance is required. As shown in the sectional view of FIG. 2, the electrical resistance of the electrodes can be reduced by forming a metal wiring (auxiliary wiring) 23 on the conductive layer 15 comprising the carbon material 13 and the metal nanowire 14. The metal wiring 23 may be formed by, for example, a metal selected from the group consisting of Au, Cu, Ag, Ti, W, and Al. It is preferable to form the metal wiring 23 by using a metal foil able to perform contact bonding and an Ag paste able to print patterns.

Second Embodiment

Figure 3:
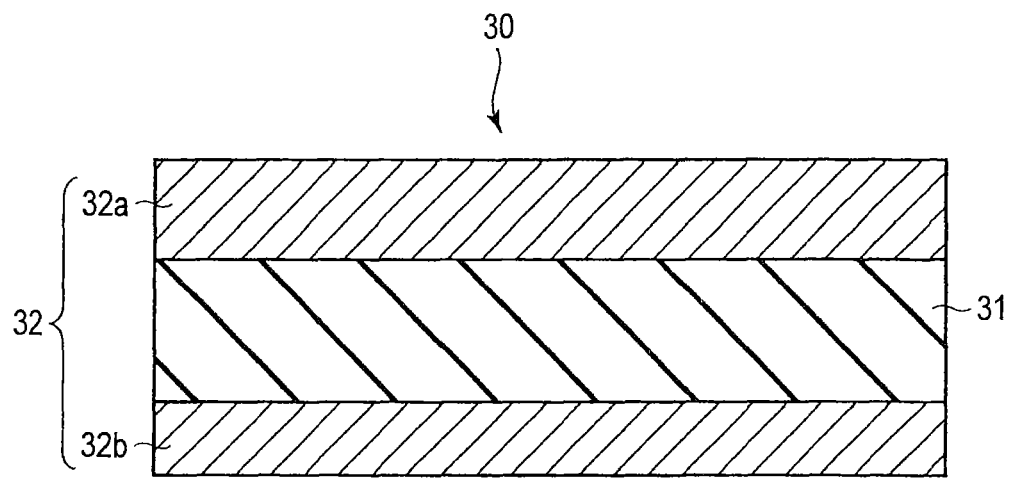
FIG. 3 is a schematic view showing an embodiment of an electric device.

FIG. 3 is a schematic view showing an example of a photoelectric conversion device 30 of this embodiment. The photoelectric conversion device 30 has a photoelectric conversion layer 31 as a functional layer and a pair of electrodes 32 including a positive electrode 32a and a negative electrode 32b. At least one of the positive electrode 32a and the negative electrode 32b contains the above-mentioned transparent conductive film. That is, at least one of the positive electrode 32a and the negative electrode 32b is configured by the transparent conductive film comprising a conductive layer including a graphene-containing carbon material and a metal nanowire, and a polymer layer provided on the metal nanowire and containing a transparent polymer having a glass transition temperature of 100° C. or less.

A part of the carbon atoms in the graphene is preferably substituted with a nitrogen atom or a boron atom. The binding of the metal nanowires to the graphene is enhanced by the presence of nitrogen atoms. The introduction of the quaternary nitrogen into the graphene structure decreases the work function, thereby to increase the performance as the negative electrode 32b. The work function of the negative electrode 32b is preferably equal to or smaller than that of Al. This is because exchange of electrons between the photoelectric conversion layer 31 and the negative electrode 32b is smoothly performed. If a part of carbon atoms in the graphene is substituted with a boron atom, the work function is increased to enhance the performance as the positive electrode 32a.

The conductive layer containing the metal nanowires may include a transparent conductive material such as ITO nanoparticles and a transparent conductive polymer.

The transparent polymer layer is configured by a transparent polymer having a glass transition temperature of 100° C. or less. Particularly, in the production of an electric device by binding a transparent conductive film to the photoelectric conversion layer 31 as the functional layer by means of lamination, a simple processing can be performed at a low temperature under a low pressure. As a result, it is possible to prevent deterioration of the photoelectric conversion layer 31, resulting in prevention of deterioration of device characteristics as well as prevention of shortening the life.

If the refractive index at a wavelength of 550 nm of the transparent polymer layer is 1.6 or more, it is possible to increase the light extraction efficiency from the photoelectric conversion layer 31. The refractive index at a wavelength of 550 nm of the transparent polymer layer is preferably 1.9 or less.

It is preferable that metal wirings (not shown) are formed on the metal nanowires at an electrode containing the transparent conductive film. This allows the electric resistance of the electrode to be further reduced. Usable examples of the material of the metal wiring include Au, Cu, Ag, titanium (Ti), W, and Al. It is preferable to use an Ag paste which can be prepared by the coating method or a metal foil which can be pressure-bonded.

In this embodiment, any conventionally known materials can be used for the photoelectric conversion layer 31. The photoelectric conversion layer 31 includes at least n-type and p-type materials. It is preferable that each material is included in separate layers. When the n-type and p-type materials are present in a single-layer, it is preferable that they are almost separated. By the presence of such n-type and p-type materials that satisfy the predetermined conditions, it becomes possible to efficiently perform charge separation or charge injection.

As the photoelectric conversion device 30, there are specifically exemplified a solar cell and an organic EL device, and it is possible to prepare the photoelectric conversion layer 31, depending on the type of the photoelectric conversion devices. In the case of the solar cell, usable examples of the photoelectric conversion layer 31 include a bulk heterojunction organic thin-film layer; a silicon semiconductor; or an inorganic compound semiconductor selected from InGaAs, GaAs, a chalcopyrite type, a CdTe type, an InP type, and an SiGe type.

Further, a quantum-dot containing type photoelectric conversion layer or a dye sensitized type photoelectric conversion layer may be used as the photoelectric conversion layer 31 of this embodiment. In the case of using any of them, such a photoelectric conversion layer can be prepared by simple sealing, and deterioration in output performance can be reduced even in the absence of a water removing agent and an oxygen removing agent, thereby to obtain a high efficiency.

In the case of the organic EL device, usable examples of the photoelectric conversion layer 31 include a low-molecular thin film prepared by vacuum deposition, a polymer thin film prepared by the coating method, and an inorganic compound semiconductor. As with the solar cell, in any case, high efficiency is obtained and deterioration in output performance can be reduced by simple sealing even in the absence of a water removing agent and an oxygen removing agent.

In this embodiment, the photoelectric conversion layer 31 contains preferably an organic thin film. The graphene structure which is used for the negative electrode 32b and further the positive electrodes 32a is a condensed benzene-ring structure. In the case where the organic thin film used for the photoelectric conversion layer has an aromatic ring, it is likely to interact with a graphene so that a good interface can be formed.

It is preferable that the photoelectric conversion layer 31 can be prepared by the coating method. It is possible to prepare the photoelectric conversion layer 31 having a large area with low cost. Generally, when the coating method is employed, it is difficult to completely eliminate an influence of moisture or oxygen. However, in this embodiment, because the electrode is configured by a transparent conductive film stable to moisture and oxygen, it is possible to reduce the influence of moisture and the like.

It is preferable to dispose an electron injection layer (or also referred to as an electron collecting layer) (not shown) between the negative electrode 32b and the photoelectric conversion layer 31. In the case of organic EL devices, the front electrode has an action to reduce a barrier against an electron injection from the negative electrode 32b to the photoelectric conversion layer 31. In addition, in the case of solar cells or the like, the electron injection layer has an action to reduce a barrier against an electron injection from the photoelectric conversion layer 31 to the negative electrode 32b. Further, since the electron injection layer also has blocking properties which prevent the flow of holes, the energy conversion efficiency can be increased.

Usable examples of the electron injection layer include an alkali metal salt, an alkaline earth metal salt, or an n-type oxide semiconductor, specifically including lithium fluoride, calcium fluoride, cesium carbonate, zinc oxide, niobium oxide, and titanium oxide. The ratio between the metal and oxygen does not necessarily have to be an integer ratio. In addition, using an oligomer or a polymer having a n-electron system substituted with an electron withdrawing group (e.g., fluorine, cyano group, etc.), the electron injection layer can be formed.

The transparent conductive film can also be used for the positive electrode 32a. A part of the carbon atoms in the graphene may be substituted with a nitrogen atom. In this case, it is preferred that the nitrogen content is not so high, but it is effective in enhancing the interaction with the functional layer or the metal nanowires and the graphene layer.

It is also possible to use other known materials, which have been conventionally used, for the positive electrode 32a. For example, a metal, an alloy or a semiconductor, which has a relatively large work function and is relatively stable to moisture, oxygen or the like, is used as the material for the positive electrode 32a. The use of these materials enables it to dispense with tight sealing and improvement in the duration, thereby enabling to prepare a flexible photoelectric conversion device at low cost.

A material having a larger work function than Al is more preferably used for the positive electrode 32a. The stability to moisture or oxygen is more enhanced by using a material having a larger work function than Al. Examples of the material having a larger work function than Al include specifically a stainless steel (SUS304, SUS310S, high-nitrogen stainless steel, stainless steel covered with a conductive highly corrosion-resistant film, or the like); a metal selected from Cu, Ag, zinc, titanium, tungsten, molybdenum, chromium, and nickel, and alloys of these; an ITO; an unsubstituted or boron-substituted planar graphene; an unsubstituted or boron-substituted carbon nanotube, and the like.

The particularly preferred positive electrode 32a has the following configuration. That is, the positive electrode comprises as the elements a monolayer or multilayer graphene substituted with a boron atom, ITO, nickel, chromium, molybdenum, tungsten, stainless steel, etc.

A value of the work function depends significantly on a surface structure or adsorption of other atoms. The work function can be measured by a Kelvin method (vibration capacity method), thermionic electron emission, or a photoelectric emission experiment.

A hole injection layer (or also referred to as a hole collecting layer) (not shown) is preferably provided between the positive electrode 32a and the photoelectric conversion layer 31. In the case of organic EL devices, the hole injection layer has an action to reduce a barrier against a hole injection from the positive electrode 32a to the photoelectric conversion layer 31. In addition, in the case of solar cells, the hole injection layer has an action to reduce a barrier against a hole injection from the photoelectric conversion layer 31 to the positive electrode 32*a*. Further, since the electron injection layer has also blocking properties which prevent the flow of holes, the energy conversion efficiency can be increased.

As the hole injection layer, for example, p-type semiconductors, such as poly(3,4-ethylenedioxythiophene)/poly(styrene sulfonic acid) (PEDOT/PSS) composite, vanadium oxide, molybdenum oxide nickel oxide, chromium oxide, or the like, can be used. The ratio between the metal and oxygen in the metal oxide such as vanadium oxide and the like does not necessarily have to be an integer ratio.

The graphene contained in the negative electrode 32*b* is preferably doped with electron donating molecules or atoms. Alternatively, the graphene of the positive electrode 32*a* is preferably doped with electron accepting molecules or atoms. The doping of the given molecules and atoms increases the electric conductivity of the graphene, and facilitates electron injection and hole injection to each electrode formed of a transparent conductive film containing graphene.

The electron donating molecule can be selected from phthalocyanines, ferrocenes, porphyrins, TTFs, phenylenediamines, tertiary amines, quaternary ammonium salts, quaternary phosphonium salts, and the like. The electron donating atom can be selected from, for example, alkaline metals, alkaline earth metals, aluminum, zinc, iron, and the like. Ions or nanoparticles can be used as the metal.

The electron accepting molecule can be selected from, for example, TCNQs, quinones, halogen molecules, quinonediimines, nitric acid, hydrochloric acid, sulfuric acid, perchloric acid, gold trichloride, iron trichloride, and the like. The halogen molecules to be used are doped in an atomic (ionic) state such as chlorine ions. Particularly, it is preferable that the accepting molecules are unevenly distributed to the side of the negative electrode 32*b*. This allows for efficient charge separation and injection.

In this embodiment, the positive electrode 32*a* and the negative electrode 32*b* are preferably transparent. Making both electrodes transparent enables, for example, to generate electricity using light from both sides of the electrodes in a solar cell, while light can be emitted to both electrodes due to the transparency in an organic EL device or the like. As a result, the photoelectric conversion device 30 of this embodiment is effectively used particularly for a window or the like. In addition, when the photoelectric conversion device of this embodiment is used for an optical sensor, devices measuring different wavelengths can be laminated.

The negative electrode 32*b*, the photoelectric conversion layer 31, and the positive electrode 32*a* are preferably sealed, and the water removing agent or the oxygen removing agent is preferably not contained. This dispenses with a space for these removing agents and structural materials, thereby enabling to prepare a more flexible and inexpensive device. The negative electrode 32*b*, the photoelectric conversion layer 31, and the positive electrode 32*a* can be sealed by curing the device with use of an epoxy resin, a silicone resin, a polyolefin or the like.

As the graphene, metal nanowires, and transparent polymer for forming a transparent conductive film, it is possible to use those already described.

If the photoelectric conversion layer 31 as a functional layer generates photovoltaic power, it is preferred to use the conductive film as the electrode positioned at the light incidence side. As mentioned above, metal nanowires are contained in the transparent conductive film and they cause light scattering. In particular, when the metal nanowire comprises silver, gold, aluminum, or the like, the surface plasmon is induced and the efficiency of absorption of light by the functional layer is improved, which results in an improvement in the efficiency of a device with photovoltaic power, such as a solar cell or an optical sensor. When the electrode containing the metal nanowires is positioned at the light incidence side receiving light, such an effect is generated before absorption of light by the functional layer. Thus, this is efficient.

Further, in the lighting applications in which the photoelectric conversion layer 31 generates light, it is preferred to use a transparent conductive film containing a metal nanowire as an electrode positioned at the light extraction surface side. The metal nanowires change near-field light to propagating light within the device, which improves the efficiency of extracting light to the outside. In addition, light scattering occurs, generating harmless illumination for eyes.

When the photoelectric conversion layer 31 as the functional layer can be divided into pixels to be displayed, it is preferred to use the transparent conductive film containing the metal nanowires as an electrode opposed to the display side. As described above, when the metal nanowires are mixed into the electrodes, light scattering occurs. Since white turbidity is caused by light scattering, it becomes a little hard to see the display if the electrodes containing the metal nanowires are positioned at the display side. In the case of the electrodes containing the nanowires being electrodes opposed to the display side, the display becomes bright since the reflected light can be used for an organic EL display or the like. This configuration is convenient for a transparent display having both electrodes that transmit visible light.

According to this embodiment, there can be provided an electric device that is stable and highly efficient and can be made transparent.

Third Embodiment

Figure 4:
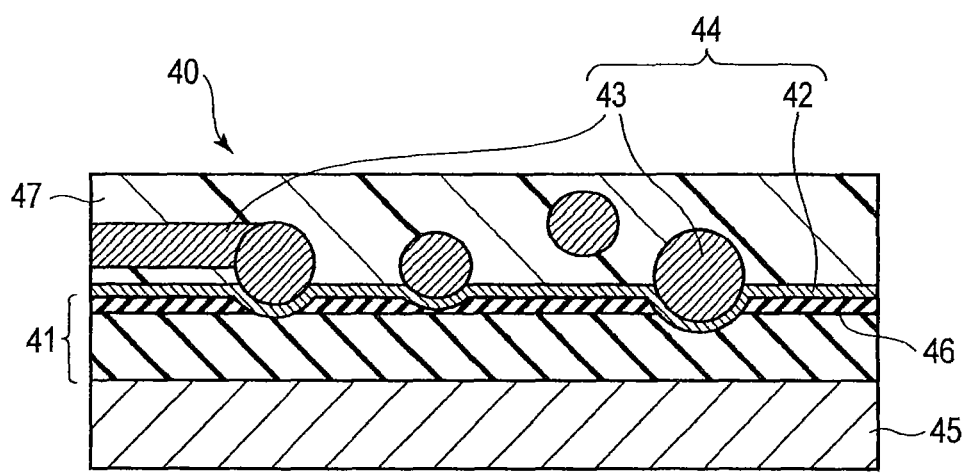
FIG. 4 is a schematic view showing another embodiment of an electric device.

FIG. 4 is a schematic view showing an example of an electric device 40 of this embodiment.

In the electric device 40 as shown in the FIG. 4, a functional layer 41 and a conductive layer 44 are provided on a counter electrode 45. The conductive layer 44 comprises a carbon material 42 including monolayer or multilayer graphene, and a metal nanowire 43. A transparent polymer layer 47 is disposed on the metal nanowire 43 and a charge injection layer 46 is present on the carbon material 42 side of the functional layer 41.

As shown in FIG. 4, the interface between the conductive layer 44 and the functional layer 41 is not flat, and a portion of the conductive layer 44 has entered the functional layer 41. It is preferred for the portion of the conductive layer to enter the inside of the functional layer so long as such entry is within 30% of the thickness of the functional layer 41.

If the functional layer 41 generates light, the refractive index of the functional layer is generally high. For example, in the case of an organic EL device, the refractive index of the functional layer is about 1.8, and in the case of an inorganic semiconductor, the refractive index of the functional layer is 2.0 or more. Therefore, light generated in the functional layer is easy to be confined in this functional layer. If the metal nanowires are contained in the electrode provided on one surface of the functional layer, the metal nanowires can change the confined light (near-field light) into propagating light so that such light can be emitted to the outside.

As shown in FIG. 4, if a portion of the conductive layer 44 comprising the metal nanowire 43 has entered the inside of the functional layer 41, the confined light is converted more easily. If such entry of the conductive layer 44 is up to 30% of the thickness of the functional layer 41, no disadvantages arise. That is, there is no possibility for a short circuit to occur due to poor current balance. The depth of entry into the functional layer 41 is preferably 20% or less and 5% or more of the thickness of the functional layer 41.

It is simple and most preferable to prepare the electric device 40 of this embodiment by laminating the transparent conductive film on the functional layer 41 shown in FIG. 1. The amount of the conductive layer 44 entering the functional layer 41 is controlled by setting the temperature and pressure during lamination. In particular, it is important to prevent short circuits. Alternatively, after laminating the layer of the carbon material 42 and the layer of the metal nanowire 43 on the functional layer 41, the laminate is pressed to allow the conductive layer 44 to enter the inside of the functional layer 41. Then, a transparent polymer solution may be applied for the production. In this case, the effect of the glass transition temperature of the transparent polymer layer 47 is not affected, but preparation of the carbon material 42 as well as resistance of the functional layer 41 for the polymer solution is required.

Fourth Embodiment

Figure 5:
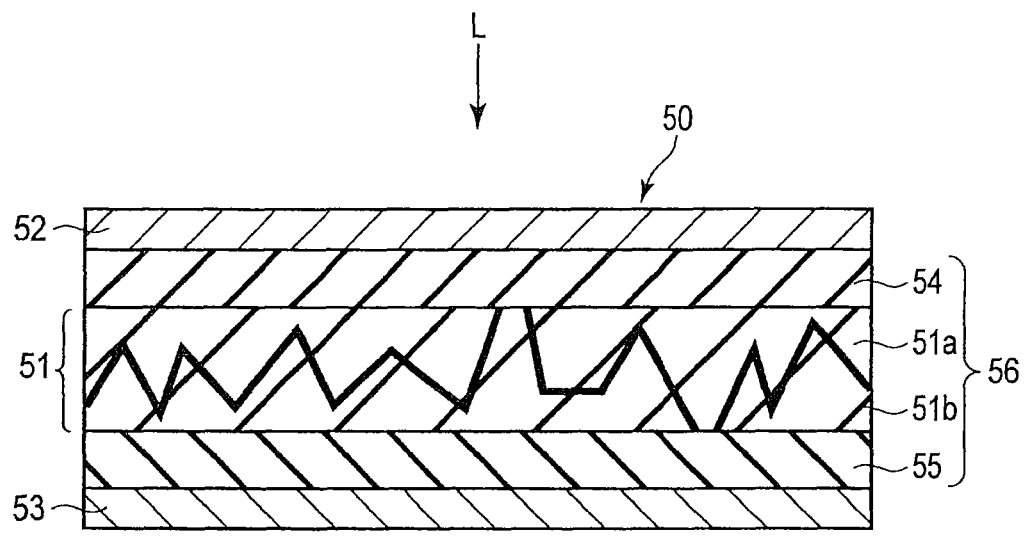
FIG. 5 is a schematic view showing another embodiment of an electric device.

FIG. 5 is a schematic view showing an example of a solar cell 50 of this embodiment.

The solar cell 50 is a device having a function to convert light energy of the light L, such as solar light incident on the cell and the like, into electricity.

The solar cell 50 includes a photoelectric conversion layer 51, a negative electrode (front electrode) 52 formed on one surface of the photoelectric conversion layer 51, and a positive electrode (back electrode) 53 formed on the opposite surface of the photoelectric conversion layer 51. An electron injection layer 54 is provided between the photoelectric conversion layer 51 and the negative electrode 52, and a hole injection layer 55 is provided between the photoelectric conversion layer 51 and the positive electrode 53.

The photoelectric conversion layer 51 is a semiconductor layer to convert light energy of incident light L into electricity, thereby to generate an electric current, and includes an n-type semiconductor layer 51a of the negative electrode 52 side and a p-type semiconductor layer 51b of the positive electrode 53 side. In general, the interface between the n-type semiconductor layer 51a and the p-type semiconductor layer 51b has a convexo-concave structure to enhance the light absorbing performance. A functional layer 56 is configured by the hole injection layer 55, the photoelectric conversion layer 51, and the electron injection layer 54.

In this solar cell 50, the transparent conductive film described above is used as at least one electrode of the negative electrode 52 and the positive electrode 53.

The solar cell (cell) of this embodiment can also be used as an optical sensor. The metal nanowire film and the graphene thin film have transparency in the visible light and near-infrared region so that the efficiency of the solar cell is increased. Further, when a photoelectric conversion layer sensitive to the near-infrared region is used, it can be utilized as an infrared sensor.

According to this embodiment, there is provided a solar cell that is stable and highly efficient and can be made transparent.

Fifth Embodiment

Figure 6:
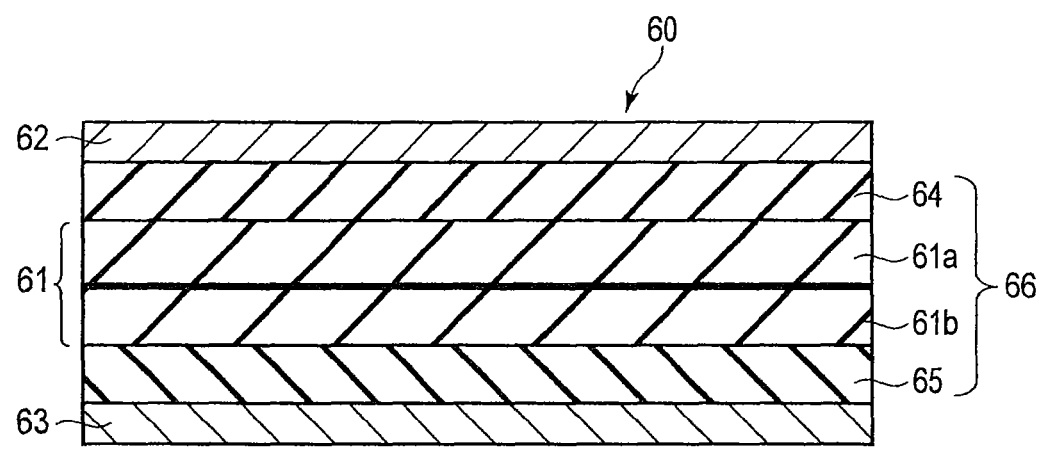
FIG. 6 is a schematic view showing another embodiment of an electric device.

FIG. 6 is a schematic view showing an example of an organic EL device 60 of this embodiment.

The organic EL device 60 is a device having a function as a light-emitting device to convert electric energy input to the device into light.

The organic EL device 60 includes a photoelectric conversion layer 61, a negative electrode (front electrode) 62 formed on one surface of the photoelectric conversion layer 61, and a positive electrode (back electrode) 63 formed on the opposite surface of the negative electrode 62 of the photoelectric conversion layer 61. An electron injection layer 64 is provided between the photoelectric conversion layer 61 and the negative electrode 62, and a hole injection layer 65 is provided between the photoelectric conversion layer 61 and the positive electrode 63.

The photoelectric conversion layer 61 is an organic thin-film layer to recombine electrons injected from the negative electrode 62 and holes injected from the positive electrode 63, thereby converting electric energy into light. The photoelectric conversion layer 61 includes an n-type semiconductor layer 61a of the negative electrode 62 side and a p-type semiconductor layer 61b of the positive electrode 63 side. A functional layer 66 is configured by the electron injection layer 64, the n-type semiconductor layer 61a, the p-type semiconductor layer 61b, and the hole injection layer 65.

In the organic EL device 60 of this embodiment, the conductive material including the graphene layer and the metal nanowire is used for at least one of the negative electrode 62 and the positive electrode 63.

According to this embodiment, there is provided an organic EL device that is stable and highly efficient and can be made transparent.

Sixth Embodiment

Figure 7:
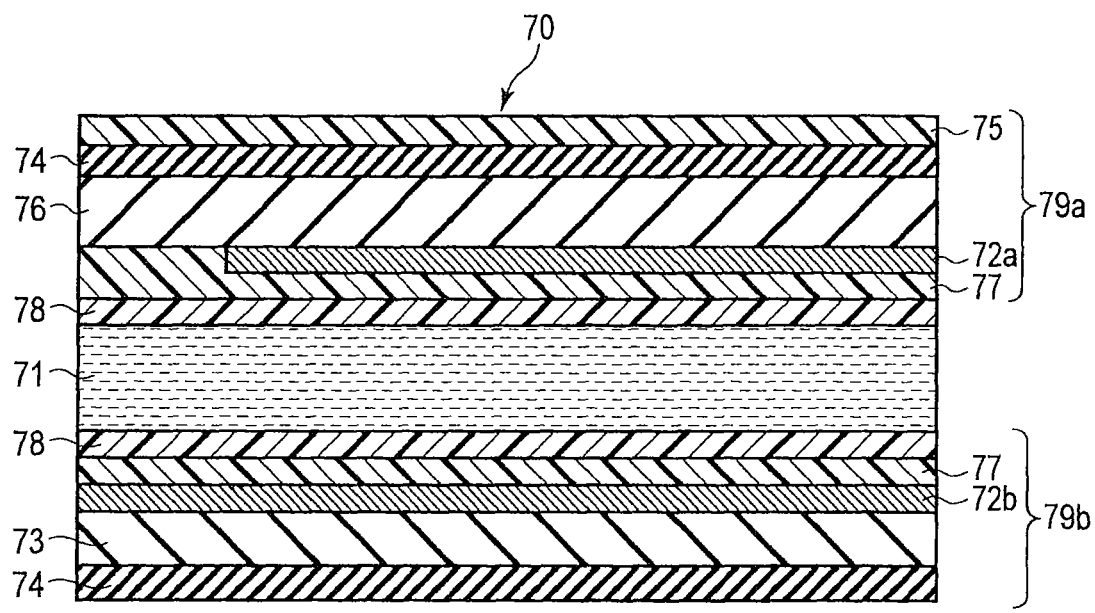
FIG. 7 is a schematic view showing another embodiment of an electric device.

FIG. 7 is a schematic view showing an example of a liquid crystal display 70 of this embodiment. The FIG. 7 shows a structure of one pixel.

A liquid crystal display 70 shown in the FIG. 7 has a display side member 79a, a support side member 79b, and a liquid crystal layer 71 disposed between the display side member 79a and the support side member 79b. The display side member 79a comprises a TFT substrate 76 on which a TFT element for driving is provided, and a polarizing plate 74 and a color filter layer 75 are sequentially formed outside of the TFT substrate 76. A front electrode 72a, an insulating film 77, and a liquid crystal orientation film 78 are provided sequentially inside of the TFT substrate 76.

Meanwhile, the support side member 79b includes a support substrate 73, and the polarizing plate 74 is provided on the outer side of the support substrate 73. A back electrode 72b, an insulating film 77, and a liquid crystal orientation film 78 are provided sequentially in the inside of the support substrate 73. A waveguide plate for backlighting may be provided on the support side member 79b.

In the liquid crystal display 70 of this embodiment, the above-mentioned transparent conductive film including the graphene layer and the metal nanowire is used for at least one of the front electrode 72a and the back electrode 72b.

A functional layer such as the liquid crystal layer 71 can be divided into each pixel to be displayed. In this case, it is preferred that the back electrode 72b comprises the transparent conductive film described above containing the metal nanowires. As already described, when the metal nanowires are mixed into the electrode, light scattering occurs. As a result, white turbidity is caused by light scattering, and it becomes slightly hard to see the display. However, in the case of the back electrode opposed to the display side, it does not become hard to see a display in the liquid crystal display 70.

According to this embodiment, there is provided a stable, lightweight, and flexible liquid crystal display.

Seventh Embodiment

Figure 8:
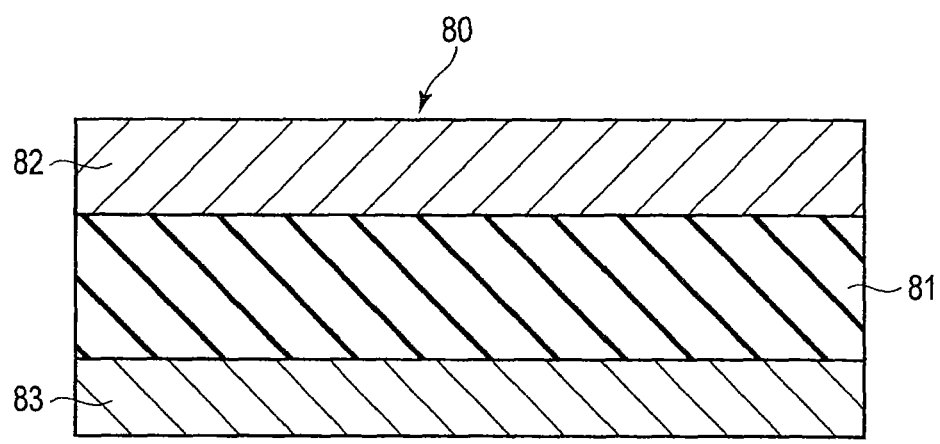
FIG. 8 is a schematic view showing another embodiment of an electric device.

FIG. 8 is a schematic view showing an example of a dimmer device 80 of this embodiment.

The dimmer device 80 includes a dimmer layer 81, a front electrode 82 formed at the display surface side, and a back electrode 83 formed at the opposite side. As the dimmer layer 81, an electrochromic layer or a polymer-dispersed type liquid crystal layer is preferably used so that a simple device structure can control light.

In the dimmer device 80 of this embodiment, the above-mentioned transparent conductive film including the graphene layer and the metal nanowire is used for at least one of the front electrode 82 and the back electrode 83.

According to this embodiment, there is provided a stable, lightweight, and flexible dimmer device.

Hereinafter, more specific examples of the transparent conductive film and the electric device will be shown.

Example 1

Figure 2:
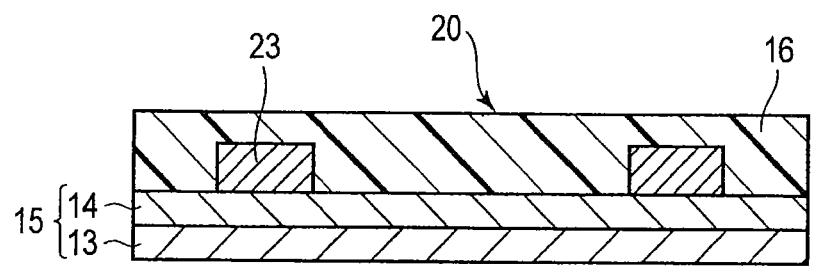
FIG. 2 is a schematic view showing another embodiment of a transparent conductive film.

The transparent conductive film 20 shown in FIG. 2 is formed. A monolayer graphene and a multilayer graphene, in which a part of carbon atoms is substituted with a nitrogen atom, are used as the carbon material 13, and a silver nanowire is used as the metal nanowire 14.

The monolayer graphene in which a part of carbon atoms is substituted with a nitrogen atom can be formed by the CVD method using a Cu foil as a base catalyst layer. The CVD is performed at 850° C. for 5 minutes using a mixed reactant gas containing ammonia:methane:hydrogen:argon at a ratio of 15:60:65:200 (ccm). Most of the graphenes to be formed by the CVD method are monolayer graphenes. However, depending on the conditions, a multilayer graphene having two or more layers may be produced. The graphene is treated in a mixed flow containing ammonia and argon at 850° C. for 5 minutes, followed by cooling in an argon flow.

The surface of the Cu foil is previously annealed by heat-treatment with laser radiation to increase the size of the crystal grain. The monolayer graphene obtained is compression-bonded to a thermal transfer film and immersed in an ammonia alkaline copper (II) chloride etchant to dissolve Cu. Thus, the monolayer graphene is transferred to a glass substrate. Four layers of the monolayer graphene are laminated to the glass substrate by repeatedly performing the same procedure.

The doping amount (N/C atomic ratio) of nitrogen in the graphene can be estimated by the X-ray photoelectron spectroscopy (XPS). Under such conditions, the ratio of nitrogen atoms to carbon atoms is from 1/100 to 1/40. The ratio of oxygen atoms to carbon atoms in the carbon material measured by XPS is from 1/100 to 1/200. In the X-ray photoelectron spectroscopy with the 1 s electron of the nitrogen atoms, the ratio of the intensity at 398.5 eV to the intensity at 401.2 eV is from 1/10 to 1/25. The work function is measured under vacuum by the ultraviolet photoelectron spectroscopy (UPS) and it is equal to or smaller than that of Al.

The silver nanowires (average diameter 110 nm, manufactured by Seashell Technology LLC) are dispersed in methanol at a concentration of 2 mg/ml to prepare a dispersion liquid. This dispersion liquid is applied onto the laminated four layers of the above-mentioned graphene using an applicator to obtain a layer of metal nanowire 14. The conductive layer 15 is configured by the carbon material 13 and the layer of metal nanowire 14. The metal wiring 23 is formed by applying a paste in which silver nanoparticles are dispersed, onto the layer of metal nanowire 14 by means of screen printing.

As the transparent polymer, there is employed a block copolymer (Kurarity, manufactured by Kuraray Co., Ltd.) of butyl acrylate and methyl methacrylate. The glass transition temperature of this polymer is −40° C. An ethyl acetate solution of the polymer is applied to a glass substrate with an applicator to prepare the transparent polymer layer 16. Then, the polymer layer is peeled from the glass substrate in water to obtain the transparent conductive film 20 of 30 µm.

When portions where the metal wiring 23 in the transparent conductive film of this Example is not present are measured by a four probe method with respect to the surface resistance, the surface resistance obtained is 10 to 20Ω/□. In addition, the transparent conductive film has a light transmission at 550 nm of 75 to 85%, resulting in high transparency, has an excellent electrical conductivity in the surface direction, and is flexible and stable. In addition, no change is observed in the electric conduction in the thickness direction after the bending tests of 600 times.

Comparative Example 1

A transparent conductive film of Comparative Example 1 is prepared in the same manner as Example 1, except that poly(methyl methacrylate) having a glass transition temperature of 120° C. is used in place of the block copolymer of butyl acrylate and methyl methacrylate.

The transparent conductive film obtained shows the same level of surface resistance and light transmittance as those of Example 1, but is more fragile and easy to be broken in comparison with the film of Example 1.

Example 2

The transparent conductive film 20 shown in FIG. 2 is prepared. Graphite is oxidized and dispersed in water at a concentration of 2 mg/ml. Most graphene oxides are monolayer graphenes. However, some graphene oxides have two-layer or multilayer structures. The dispersion liquid of graphene oxides is applied onto quartz glass by the dipping method. Subsequently, graphene oxide is reduced by bringing the coated film containing the graphene oxide into contact with hydrazine hydrate vapor at 100° C., thereby to introduce nitrogen atoms. Further, the resulting product is heated to 200° C. in nitrogen to obtain graphene layers comprising two layers on average, which are served as the carbon material 13.

The silver nanowires (average diameter 110 nm, manufactured by Seashell Technology LLC) are dispersed in methanol at a concentration of 2 mg/ml to prepare a dispersion liquid. This dispersion liquid is applied onto the above-mentioned graphene layer using an applicator to obtain the layer of metal nanowire 14. The metal wiring 23 is formed by applying a paste in which silver nanoparticles are dispersed, onto the metal nanowire 14 by means of screen printing.

An ethyl acetate solution using poly(ethylene terephthalate) (PET) as a transparent polymer is prepared. The glass transition temperature of PET is 70° C. Nanoparticles of barium titanate are dispersed in the ethyl acetate solution of the polymer, and the dispersion is used as a raw material for the transparent polymer layer 16. The raw material for the transparent polymer layer is applied onto the layer of metal nanowire 14 using an applicator. Then, the polymer layer is peeled from the glass substrate in water to obtain the transparent conductive film 20 of 30 μm.

When the surface resistance of the transparent conductive film of this Example is measured in the same manner as Example 1, it is found to be 10 to 20Ω/□. The transparent conductive film has a light transmission at 550 nm of 75 to 85%, indicating high transparency, and has a refractive index at 550 nm of 1.7. In addition, such film shows an excellent electric conduction in the surface direction and is flexible and stable, and no change is observed in the electric conduction in the thickness direction even after the bending tests of 600 times.

Example 3

By using, as the negative electrode 52, a transparent conductive film prepared in the same manner as Example 1, the solar cell 50 shown in FIG. 5 is prepared.

The positive electrode 53 is a sheet obtained by transferring four layers of an unsubstituted planar monolayer graphene to a PET film. The unsubstituted monolayer graphene is formed by the CVD method using a mixed reactant gas containing methane, hydrogen, and argon and using a Cu foil as the base catalyst layer. Each monolayer graphene is treated with $AuCl_3$ to increase the work function as well as to reduce the surface resistance.

A poly(3,4-ethylenedioxythiophene)/poly(styrene sulfonic acid) composite (PEDOT/PSS) is applied onto the positive electrode 53 by spin coating to form the hole injection layer 55 (film thickness of 50 nm).

Poly(3-hexylthiophene) (P3HT), i.e., a p-type polymer semiconductor, is applied onto the hole injection layer 55 by spin coating to form the p-type semiconductor layer 51b. Further, (6,6')-phenyl-C61-butyric acid methyl ester (PCBM), i.e., an n-type semiconductor, is applied thereon to form the n-type semiconductor layer 51a. The photoelectric conversion layer 51 is configured by the n-type semiconductor layer 51a and the p-type semiconductor layer 51b.

A $TiO_2$ nanoparticle thin film (10 nm in thickness) is formed on the photoelectric conversion layer 51 by the coating method to obtain the electron injection layer 54. The electron injection layer 54 also has a function as the hole blocking layer. The functional layer 56 is configured by the hole injection layer 55, the p-type semiconductor layer 51b, the n-type semiconductor layer 51a, and the electron injection layer 54.

The transparent conductive film described above is subjected to lamination pressing such that it is pressed onto the electron injection layer 54 under reduced pressure at 40° C. to form the negative electrode 52. The end surface of each layer is sealed with an epoxy resin. An anti-reflection film (not shown) is attached to each surface of the negative electrode 52 and the positive electrode 53.

Both sides of the solar cell 50 of this Example are transparent, and such solar cell can utilize the light from both sides efficiently. In addition, the solar cell 50 of this Example can be prepared by simple sealing and shows relatively low deterioration of output even in the absence of a water removing agent or an oxygen removing agent. Additionally, the solar cell 50 of this Example has a high efficiency of energy conversion in addition to being lightweight and flexible.

Example 4

The organic EL device 60 for illumination shown in FIG. 6 is prepared by using as the negative electrode 62 the transparent conductive film that is prepared by the same method as Example 2.

A nickel oxide layer having a thickness of 10 nm as the hole injection layer 65 is formed on the positive electrode 63 made of a Ni foil by UV ozone oxidation. A solution of poly(bis(4-phenyl)(2,4,6-trimethylphenyl)amine)(PTAA, manufactured by Aldrich), i.e., a p-type organic semiconductor is spin coated on the hole injection layer 65 to obtain the p-type semiconductor layer 61b. The thickness of the p-type semiconductor layer 61b is 50 nm.

The n-type semiconductor layer 61a (40 nm in thickness) is formed on the p-type semiconductor layer 61b by vapor-depositing tris(8-hydroxyquinoline)aluminum (Alq3). The Alq3 is an n-type semiconductor to transport electrons, wherein the n-type semiconductor layer 61a also functions as a light-emitting layer. LiF is vapor-deposited on the n-type semiconductor layer 61a to form the electron injection layer 64 (1.5 nm in thickness).

The functional layer 66 is configured by the hole injection layer 65, the p-type semiconductor layer 61b, the n-type semiconductor layer 61a, and the electron injection layer 64.

The transparent conductive film described above is subjected to lamination pressing such that it is pressed onto the functional layer 66 under reduced pressure at 70° C. to laminate the negative electrode 62, thereby to obtain the organic EL device 60. The end surface of each layer is sealed with an epoxy resin. A film with uneven surface (not shown) is attached to the surface of the negative electrode 62 so as to increase the light extraction efficiency.

The functional layer 66 in the organic EL device 60 shown in FIG. 6 corresponds to the functional layer 41 in the electric device 40 of FIG. 4, and the negative electrode 62 comprising the transparent conductive film corresponds to the structure comprising the conductive layer 44 and the transparent polymer layer 47.

When the cross-section of the organic EL device of this Example is observed with SEM, it is found that the conductive layer corresponding to the silver nanowires enters the functional layer to the degree of about 5 to 20 nm at the interface between the negative electrode 62 and the functional layer 66, as shown in FIG. 4.

The organic EL device 60 of this Example can be prepared by simple sealing and shows a relatively low degradation rate of emission intensity even in the absence of a water removing agent or an oxygen removing agent. Moreover, the organic EL device of this Example also shows a high emission efficiency in addition to being lightweight and flexible.

Example 5

The organic EL device 60 for illumination, shown in FIG. 6, is prepared by using, as the negative electrode 62, a transparent conductive film prepared by the same method as Example 1. The positive electrode 63 is prepared in the same manner as that shown in Example 3.

LiF is vapor-deposited on the negative electrode 62, thereby forming the electron injection layer 64 (1.5 nm in thickness). The n-type semiconductor layer 61a (40 nm in thickness) is prepared by vapor-depositing tris(8-hydroxyquinoline)aluminum (Alq3) on the electron injection layer 64. The Alq3 is an n-type semiconductor to transport electrons, wherein the n-type semiconductor layer 61a also functions as a light-emitting layer.

N,N'-di-1-naphthyl-N,N'-diphenyl-1,1'-biphenyl-4,4'-diamine (NPD) is vapor-deposited on the n-type semiconductor layer 61a to form the p-type semiconductor layer 61b (30 nm in thickness). The photoelectric conversion layer 61 is configured by the n-type semiconductor layer 61a and the p-type semiconductor layer 61b.

A poly(3,4-ethylenedioxythiophene)/poly(styrene sulfonic acid) composite (PEDOT/PSS) is applied onto the positive electrode 63 by spin coating to form the hole injection layer 65 (50 nm in thickness).

Lamination pressing is performed under reduced pressure at 60° C. so that the photoelectric conversion layer 61 is brought into contact with the hole injection layer 65 to produce the organic EL device 60. The end surface of each layer is sealed with an epoxy resin. As shown in FIG. 6, the functional layer 66 is configured by the hole injection layer 65, the p-type semiconductor layer 61b, the n-type semiconductor layer 61a, and the electron injection layer 64.

A film with uneven surface (not shown) is attached to each surface of the negative electrode 62 and the positive electrode 63 so as to increase the light extraction efficiency.

The organic EL device 60 of this Example can be prepared by simple sealing and shows a relatively low deterioration rate of emission intensity even in the absence of a water removing agent or an oxygen removing agent. Moreover, the organic EL device of this Example also shows high emission efficiency in addition to being transparent and capable of double-sided light emission. Further, the organic EL device of this Example is lightweight and flexible.

Example 6

The liquid crystal display device 70 shown in FIG. 7 is produced. As the back electrode 72b that faces the display side, there is employed a transparent conductive film comprising a carbon material and a metal nanowire layer. The carbon material is a monolayer graphene and a multilayer graphene, wherein a part of carbon atoms is substituted with a nitrogen atom. The metal nanowire is a silver nanowire, and silver nanoparticles are contained in the nanowire layer.

In the production of a planar graphene in which a part of carbon atoms is substituted with a nitrogen atom, a polyacrylonitrile film is first cast on a quartz glass and heated in air at 300° C. for 1 hour. Then, the film is heated at 1000° C. for 10 minutes under vacuum to graphitize the constituents of the thin film. The obtained structure is transferred to a heat transfer film in water to obtain a desired graphene.

Under these conditions, the ratio of nitrogen atoms to carbon atoms in the graphene as measured by XPS is from 1/20 to 7/100. The ratio of oxygen atoms to carbon atoms in the graphene as measured by XPS is from 1/10 to 1/15. In the X-ray photoelectron spectroscopy with the 1 s electron of nitrogen atoms, the ratio of the intensity at 398.5 eV to the intensity at 401.2 eV is from 1.25 to 0.8.

Using a silver nanowire (average diameter of 110 nm), a metal nanowire layer is formed on the monolayer graphene layer in which a part of carbon atoms is substituted with a nitrogen atom. The silver nanowire is first dispersed in methanol at a concentration of 2 mg/ml to prepare a dispersion liquid. The dispersion liquid is applied onto the monolayer graphene layer using an applicator to obtain a silver nanowire layer. This is dried in a nitrogen stream for 1 hour and transferred to the support substrate 73 comprising a PET film having aluminum wiring. A polyimide film as the insulating film 77 is formed on the PET film. Further, the liquid crystal orientation film 78 including another polyimide is formed thereon.

On the other hand, a TFT element is provided on a PET substrate to obtain the TFT substrate 76, and an unsubstituted graphene layer which is divided into pixels as the front electrode 72a on the PET substrate. The unsubstituted graphene layer can be formed by the CVD method. Specifically, the unsubstituted graphene layer is formed by using a mixed reactant gas containing methane, hydrogen, and argon with a Cu foil as the base catalyst layer. The obtained unsubstituted graphene layer is transferred to a heat transfer film and then transferred to the substrate on which the TFT element is prepared, thereby to form the front electrode 72a on the TFT substrate 76.

A resist film is formed on the front electrode 72a, and subjected to pattern exposure and development to obtain a resist pattern. Then, using the resist pattern as a mask, the graphene layer is patterned by oxygen plasma to form a pixel electrode. A polyimide film as the insulating film 77 is prepared on the electrode, and the liquid crystal orientation film 78 including another polyimide is further formed thereon.

A substrate having the front electrode 72a is attached to a substrate having the back electrode 72b with a spacer interposed therebetween so that the liquid crystal orientation films 78 face each other. Subsequently, a liquid crystal layer is injected into between the liquid crystal orientation films 78 under vacuum and the end surface is sealed with an epoxy resin. The polarizing plates 74 are respectively placed on both the outer sides, and the color filter 75 is formed on the polarizing plate 74 of the display side to obtain the liquid crystal display 70.

The liquid crystal display 70 of this Example is flexible and lightweight, and has no change in the display performance even after the bending tests of 500 times.

Example 7

The dimmer device 80 shown in FIG. 8 is produced using an electrochromic layer as the dimmer layer 81. The back electrode 83 is prepared in the same manner as the negative electrode in Example 3. The front electrode 82 is prepared in the same manner as the positive electrode in Example 3. An amorphous film comprising $WO_3$ is formed on the front electrode 82 by RF magnetron sputtering.

The substrate of the front electrode 82 is attached to the substrate of the back electrode 83 with a spacer interposed therebetween. An aqueous lithium chloride solution is injected into the gap of the two substrates and the inlet is sealed. The electrochromic layer 81 comprising an electrolyte layer including the aqueous lithium chloride solution and a $WO_3$ film is prepared as described above.

The dimmer device 80 obtained exhibits a transmittance of 70 to 80% in a transparent state and is flexible and lightweight. Additionally, in such dimmer device 80, no change is observed in the display performance even after the bending tests of 500 times.

Example 8

The organic EL device 60 shown in FIG. 6 is produced in the same manner as Example 4 except that a positive electrode 63 is changed to a stainless steel foil (SUS304) and the hole injection layer 65 is changed to an MoO$_3$ vacuum-deposited film (10 nm in thickness).

Although light emitted from the positive electrode 63 is lost in the organic EL device 60 obtained, there is reflected light. Thus, the amount of light emitted from the negative electrode 62 is increased. Further, the organic EL device 60 of this Example can be prepared by simple sealing, and shows relatively low deterioration of output even in the absence of a water removing agent or an oxygen removing agent. Further, the organic EL device 60 of this Example has high light-emitting efficiency in addition to being lightweight and flexible.

Example 9

The thin-film silicon film is used as the photoelectric conversion layer 51 to produce the solar cell 50 shown in FIG. 5. An amorphous (p-i-n) Si layer, a buffer (oxide film) layer, and a microcrystal (n-i-p) Si layer are formed on the positive electrode 53. The transparent conductive film obtained in Example 2 is subjected to vacuum lamination press thereon at 70° C. under reduced pressure to prepare the solar cell 50. Other configurations are the same as those of Example 3.

The solar cell 50 obtained can be prepared by simple sealing and even if neither the water removing agent nor the oxygen removing agent is contained, deterioration of output is relatively low. Further, the solar cell 50 of this Example has a high energy conversion efficiency in addition to being lightweight and flexible.

Example 10

Figure 9:
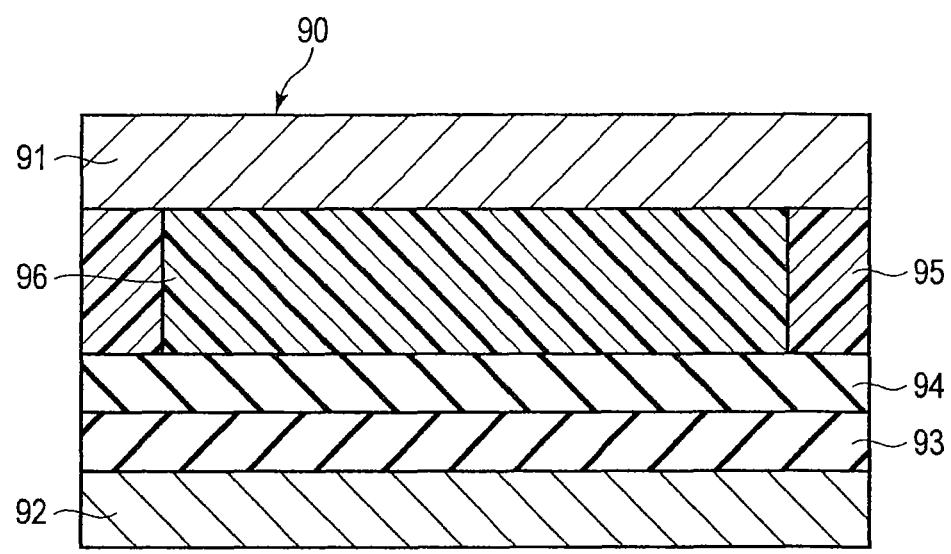
FIG. 9 is a schematic view showing a solar cell device of the Example.

FIG. 9 is a schematic view showing a transparent solar cell with a partially different configuration from the solar cell 60 shown in FIG. 6.

The positive electrode 91 in the solar cell 90 shown in FIG. 9 includes a glass substrate and a conductive layer formed on the glass substrate. As already described, the conductive layer with a transparent polymer layer provided thereon includes a silver nanowire and a graphene layer comprising monolayer and multilayer graphenes in which the planar carbon atoms are partially substituted with nitrogen atoms.

In order to form the positive electrode 91, silver nanowires (average diameter 110 nm) are dispersed in methanol at a concentration of 3 mg/ml to prepare a dispersion liquid. Furthermore, the monolayer and multilayer graphene oxide obtained by oxidizing graphite is dispersed in water at a concentration of 3 mg/ml to obtain an aqueous dispersion.

A block copolymer (Kurarity, manufactured by Kuraray Co., Ltd.) of butyl acrylate and methyl methacrylate is used and this polymer has a glass transition temperature of −40° C. An ethyl acetate solution of the polymer is applied to a glass substrate with an applicator to prepare a transparent polymer layer. Then, a methanol dispersion in which silver nanowires are dispersed is applied onto the polymer with an applicator to form a silver nanowire layer. An ITO fine particles-dispersed film manufactured by Aldrich is formed on this silver nanowire layer by spin coating. Then, an aqueous dispersion of graphene oxide is subjected to spin coating to form a film, which is then dried. Thereafter, the film is left in a vapor of hydrazine hydrate of 90° C. for 1 hour and then heated for pressure-bonding under vacuum at 200° C. for 1 hour. Thus, there is obtained a conductive material showing a surface resistance of 10 to 20Ω/☐ and a light transmittance at 550 nm of 75 to 80%, and it is used as the transparent positive electrode 91

Subsequently, a mixed salt obtained by mixing TiCl$_4$, NaCl, and KCl at a weight ratio of 1:1:1 is heated to 400° C. and melted to obtain a molten salt. The fluorine-doped tin oxide transparent conductive film (negative electrode) 92 is immersed in the molten salt together with a platinum electrode. A titanium metal thin film with a mass converted thickness of 100 nm is formed on the surface of the negative electrode 92 by applying a current of 10 A/m$^2$ to the negative electrode 92 as a cathode. When the surface of the titanium metal thin film is observed with a scanning electron microscope, aggregates with a dendritic structure in height of about 1 μm are observed.

The titanium metal thin film formed on the surface of the negative electrode 92 is immersed in an aqueous boric acid chloride solution (0.5 mol/L) together with a platinum electrode. A voltage of 150 V is applied to the negative electrode 92 for 5 minutes. Accordingly, the titanium metal is oxidized to form a titanium oxide thin film. The resulting titanium oxide thin film is heated at 400° C. for 5 hours to form the n-type transparent semiconductor layer 93. When the surface of the formed transparent semiconductor layer 93 is observed with a scanning electron microscope, aggregates with a dendritic structure in height of about 3 μm are observed.

The dye represented by Formula 1 below was dissolved in a solvent to prepare a dye solution. The transparent semiconductor layer 93 described above was immersed in the dye solution. The dye is adsorbed and supported on the transparent semiconductor layer 93 by heating to form the dye layer 94.

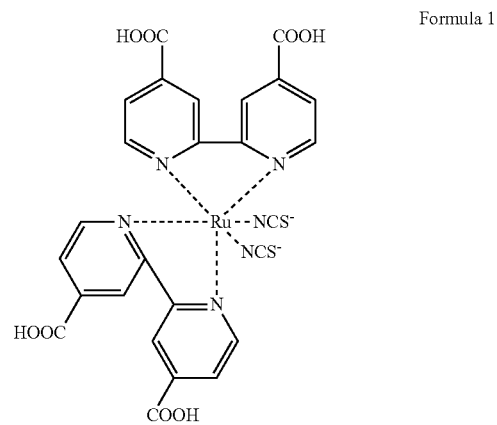

Formula 1

The glass substrate with the positive electrode 91 formed thereon and the surface of the dye layer 94 are attached and sealed with a seal adhesive (e.g., an epoxy-based resin) 95 using a 2 μm-thick spacer (not shown) interposed therebetween so that the glass substrate and the dye layer 94 are opposed to each other. Thereafter, an acetonitrile solution prepared by dissolving iodine and tetraethylammonium iodide is injected to form the charge transport layer 96. Thus, the solar cell 90 shown in FIG. 9 is obtained.

Since the graphene and the silver nanowires in the solar cell 90 of this Example are strongly attached to a glass substrate with a transparent polymer interposed therebetween, the solar cell has a high energy conversion efficiency and a long life-time.

Comparative Example 2

The solar cell of this Comparative Example is prepared in the same manner as Example 10 except that the silver nanowires are not used for the positive electrode 91.

As the silver nanowires are not contained in the solar cell of this Comparative Example, a higher electrical resistance of the electrode and lower energy conversion efficiency in comparison with that of Example 10 result.

Example 11

The solar cell 50 shown in FIG. 5 is prepared.

A nickel oxide layer as the hole injection layer 55 is formed on the positive electrode 53 made of an Ni foil by UV/ozone oxidation. Poly(3-hexylthiophene) (P3HT), i.e., a p-type polymer semiconductor, is applied onto the hole injection layer 55 by spin coating to obtain the p-type semiconductor layer 51b.

(6,6')-Phenyl-C61-butyric acid methyl ester (PCBM), i.e., an n-type semiconductor, is applied onto the p-type semiconductor layer 51b to obtain the n-type semiconductor layer 51a. The photoelectric conversion layer 51 is configured by the p-type semiconductor layer 51b and the n-type semiconductor layer 51a. A $TiO_2$ nanoparticle thin film (5 nm in thickness) is formed on the photoelectric conversion layer 51 by the coating method to obtain the electron injection layer 54. The electron injection layer 54 also functions as the hole blocking layer.

The functional layer 56 is configured by the hole injection layer 55, the p-type semiconductor layer 51b, the n-type semiconductor layer 51a, and the electron injection layer 54. The thickness of the functional layer 56 is 100 nm.

A transparent conductive film comprising the graphene layer and the metal nanowires is disposed as the negative electrode 52 on the functional layer 56. In the formation of the negative electrode 52, first, an aqueous dispersion of graphene oxide is spin coated on the functional layer 56. This is brought into contact with vapor of hydrazine hydrate at 120° C. so that graphene oxide is reduced and nitrogen atoms are introduced at the same time, thereby to obtain a graphene layer.

The silver nanowires (average diameter 60 nm, manufactured by Seashell Technology LLC) are dispersed in methanol at a concentration of 2 mg/ml to prepare a dispersion liquid. This dispersion liquid is spin-coated onto the graphene layer described above to obtain a silver nanowire layer. A conductive layer is formed by the graphene layer and the silver nanowire layer. Then, the whole structure is pressed with a press machine so that a portion of the conductive layer is allowed to enter the functional layer.

A solution of poly(ethylene naphthalate) (PEN) having a glass transition temperature of 113° C. is applied onto the conductive layer with an applicator to form a transparent polymer layer. The end surface of each layer is sealed with an epoxy resin. Further, in order to increase the light extraction efficiency, a film with an uneven surface (not shown) is bonded to the surface of the negative electrode 52.

The functional layer 56 in the solar cell 50 shown in FIG. 5 corresponds to the functional layer 41 in the electric device 40 of FIG. 4, and the negative electrode 52 corresponds to a structure comprising the conductive layer 44 and the transparent polymer layer 47.

When the cross-section of the solar cell of this Example is observed with SEM, it is found that the conductive layer corresponding to the silver nanowires enters the functional layer to the degree of about 10 to 30 nm at the interface between the negative electrode 52 and the functional layer 56, as shown in FIG. 4.

The solar cell 50 of this Example can be prepared by simple sealing and shows relatively low deterioration of energy conversion rate even in the absence of a water removing agent or an oxygen removing agent. Additionally, the solar cell of this Example has a high efficiency of energy conversion in addition to being lightweight and flexible.

According to at least an embodiment described above, it is possible to provide a transparent conductive film having a high conductivity with excellent stability and capable of being easily applied to the preparation of devices, by providing a transparent polymer layer comprising a transparent polymer having a glass transition temperature of 100° C. on a conductive layer comprising a carbon material including graphene and a metal nanowire.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electric device comprising:
a pair of electrodes, at least one of the pair of electrodes comprising a conductive layer comprising a laminated structure comprising a conductive layer and a transparent polymer layer, the conductive layer comprising a metal nanowire and a carbon material comprising graphene, the transparent polymer layer comprising a transparent polymer having a glass transition temperature of 100° C. or less, the transparent polymer being a block copolymer comprising a polymer with a glass transition temperature of 100° C. or more and a polymer with a glass transition temperature of 10° C. or less, the carbon material constituting one surface of the conductive layer; and
a functional layer disposed between the pair of electrodes.

2. The electric device according to claim 1, wherein the transparent polymer layer in the conductive transparent film has a refractive index of 1.6 or more at a wavelength of 550 nm.

3. The electric device according to claim 1, wherein a part of carbon atoms of the graphene in the transparent conductive film is substituted with a nitrogen atom or a boron atom.

4. The electric device according to claim 1, wherein the transparent conductive film further comprises a metal wiring provided on the conductive layer.

5. The electric device according to claim 1, wherein a part of the conductive layer enters the functional layer between 5% and 30% of the thickness of the functional layer.

6. The electric device according to claim 1, wherein the functional layer is a photoelectric conversion layer.

7. The electric device according to claim 6, wherein the photoelectric conversion layer comprises an n-type semiconductor layer and a p-type semiconductor layer.

8. The electric device according to claim 6, wherein one of the pair of electrodes is a positive electrode and the other is a negative electrode.

9. The electric device according to claim 8, further comprising a hole injection layer disposed between the positive electrode and the photoelectric conversion layer, and an electron injection layer disposed between the negative electrode and the photoelectric conversion layer.

10. The electric device according to claim 1, further comprising a display side member comprising a front electrode, a support side member comprising a back electrode, and a liquid crystal layer disposed between these members, one of the pair of electrodes being the front electrode and the other being the back electrode.

11. The electric device according to claim 1, wherein the transparent polymer is a block copolymer comprising a poly(acrylic acid ester) or a poly(methacrylic acid ester).

12. A transparent conductive film comprising:
a laminated structure comprising a conductive layer and a transparent polymer layer, the conductive layer comprising a metal nanowire and a carbon material comprising graphene, the transparent polymer layer comprising a transparent polymer having a glass transition temperature of 100° C. or less, the transparent polymer being a block copolymer comprising a polymer with a glass transition temperature of 100° C. or more and a polymer with a glass transition temperature of 10° C. or less, the carbon material constituting one surface of the transparent conductive film.

* * * * *